United States Patent
Rissing et al.

(10) Patent No.: US 7,535,729 B2
(45) Date of Patent: May 19, 2009

(54) OPTOELECTRONIC SYSTEM AND METHOD FOR ITS MANUFACTURE

(75) Inventors: Lutz Rissing, Seebruck (DE); Dietmar Siglbauer, Wonneberg (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 450 days.

(21) Appl. No.: 11/431,195

(22) Filed: May 9, 2006

(65) Prior Publication Data

US 2006/0278955 A1      Dec. 14, 2006

(30) Foreign Application Priority Data

May 9, 2005      (DE) .................. 10 2005 021 991

(51) Int. Cl.
*H05K 7/10* (2006.01)
(52) U.S. Cl. .................. 361/767; 361/760; 361/770; 361/777; 174/259; 174/261; 174/263; 174/268
(58) Field of Classification Search .................. 361/743, 361/760, 767, 770, 777, 806–808, 783; 174/254, 174/257, 259, 260–263, 268
See application file for complete search history.

(56) References Cited

U.S. PATENT DOCUMENTS

| | | | | |
|---|---|---|---|---|
| 5,825,628 A | * | 10/1998 | Garbelli et al. | ............. 361/763 |
| 6,075,712 A | * | 6/2000 | McMahon | ................... 361/783 |
| 6,320,757 B1 | * | 11/2001 | Liu | ............................. 361/760 |
| 6,861,683 B2 | * | 3/2005 | Rissing et al. | .............. 257/225 |
| 7,058,309 B1 | | 6/2006 | Eisenberger et al. | |
| 2002/0172025 A1 | * | 11/2002 | Megahed et al. | ............ 361/767 |
| 2004/0124007 A1 | * | 7/2004 | Ashida | ........................ 174/260 |
| 2004/0179344 A1 | * | 9/2004 | Uchida et al. | ................ 361/777 |

FOREIGN PATENT DOCUMENTS

| | | |
|---|---|---|
| DE | 100 21 367 | 11/2001 |
| DE | 101 18 231 | 10/2002 |
| EP | 0 303 808 | 2/1989 |
| WO | WO 00/07052 | 2/2000 |

* cited by examiner

*Primary Examiner*—Dean A. Reichard
*Assistant Examiner*—Hoa C Nguyen
(74) *Attorney, Agent, or Firm*—Kenyon & Kenyon LLP

(57) ABSTRACT

An optoelectronic system includes a printed circuit board having a ground pad and a bond pad as well as an optoelectronic element. The optoelectronic element is electrically connected to the bond pad via a bonding wire and is additionally fastened to the ground pad by a soldering connection. The ground pad is arranged such that one part of the space between the printed circuit board and the optoelectronic element is not filled with solder. Furthermore, a method is for manufacturing such an optoelectronic system.

5 Claims, 3 Drawing Sheets

A - A

OPTOELECTRONIC SYSTEM AND METHOD FOR ITS MANUFACTURE

CROSS-REFERENCE TO RELATED APPLICATION

This application claims priority to Application No. 10 2005 021 991.8, filed in the Federal Republic of Germany on May 9, 2005, which is expressly incorporated herein in its entirety by reference thereto.

FIELD OF THE INVENTION

The present invention relates to an optoelectronic system and a method for its manufacture.

BACKGROUND INFORMATION

Optoelectronic systems are used, for example, for detecting modulated light in optically functioning position-measuring devices. The light includes position information. Following the conversion of the light into electrical signals with the aid of optoelectronic elements, such as photoelements, for example, the position information may be processed further electronically and evaluated.

Semiconductor components, in particular, silicone components, which are mounted on a printed circuit board are often used as photoelements. Additionally, the lower side of the photoelement is often fastened in an electrically conductive manner to a pad of the printed circuit board, and the radiation-sensitive surface, which is usually facing away from the printed circuit board, is connected by a wire bond connection to a circuit track of the printed circuit board. The signals are applied between the wire bond connection and the pad on the lower side of the photoelement.

Quite often, however, the photoelements, e.g., CMOS chips, are soldered to a pad of the printed circuit board only for mechanical fastening, without signals being conducted from this pad. In this arrangement, two or more wire bond connections usually extend from the photoelement to the printed circuit board, via which the signals are conducted.

German Published Patent Application No. 101 18 231 of the assignee hereof describes a corresponding optoelectronic system. This optoelectronic system may have the disadvantage that significant reject rates are found in their manufacture.

SUMMARY

Example embodiments of the present invention may provide optoelectronic devices which may be of high quality and which may be manufactured in an extremely economical manner. Correspondingly, an improved method for manufacturing optoelectronic systems may be provided.

The optoelectronic system may include a printed circuit board having a ground pad and a bond pad as well as an optoelectronic element. The optoelectronic element makes electrical contact with the bond pad at least via one bonding wire and is attached on the ground pad by a soldering connection. The ground pad is arranged such that a part of the interstice between the printed circuit board and the optoelectronic element is not filled with solder. Accordingly, the interstice between the printed circuit board and the optoelectronic element is only partially or incompletely filled with solder. The ground pad may incidentally also be called a connector pad.

With the aid of such a system, the reject rates in the manufacture of the optoelectronic system may be reduced significantly.

The positions of the optoelectronic elements are usually optically inspected or ascertained with the aid of a camera following the soldering to the ground pad and prior to wire bonding. For conventionally arranged ground pads, this optical inspection is repeatedly flawed. This has the consequence that the contact is established by the bonding wire at the wrong location on the optoelectronic element, which renders the system thus manufactured useless.

Optoelectronic elements are photoelements, for example, by which light may be converted into electrical signals. These may also be so-called optical chips or optical ASICs, which in addition to the photosensitive regions also have integrated electrical circuits. The optoelectronic system is arranged as a photodetector system. Furthermore, optoelectronic elements also include light-emitting or light-producing components, which normally have smooth reflective surfaces in order to radiate the produced light, e.g., in an optimized manner. All optoelectronic elements in the present context have in common that they have an extremely strongly reflective surface.

The reason for a faulty optical inspection may be in that the extremely smooth and reflective surface of the optoelectronic element is at times not mounted sufficiently parallel with respect to the printed circuit board. This means that effects of reflection interfere with the optical inspection or the optical detection of the position of the optoelectronic elements. The system hereof may make it significantly easier to provide a plane-parallel alignment of the optoelectronic element with respect to the printed circuit board. Furthermore, optoelectronic elements arranged at irregular angles may have a negative effect on the quality of the wire bond connections irrespective of the problem of position detection.

Example embodiments of the present invention include optoelectronic systems in which the soldering connection between the ground pad and the printed circuit board is used for electrically connecting the optoelectronic element as well as optoelectronic systems in which the soldering connection is used merely for mechanically fastening the optoelectronic element to the printed circuit board.

The optoelectronic device may be arranged such that the interstice at the edge of the surface of the optoelectronic element, which is facing the printed circuit board is for the most part filled with solder.

The ground pad may have a symmetrical arranged, e.g., in the shape of an H. This may provide an excellent plane-parallelism with respect to the printed circuit board, that is, a parallel alignment in two dimensions.

For the same purpose, the longer sides of the optoelectronic element may be parallel with respect to the shanks of the H-shaped ground pad, the optoelectronic element having a rectangular base area.

According to an example embodiment of the present invention, an optoelectronic system includes: a printed circuit board including a ground pad and a bond pad; an optoelectronic element electrically connected to the bond pad by a bonding wire and fastened to the ground pad by a soldered connection, the ground pad arranged so that a part of an interstice between the printed circuit board and the optoelectronic element is not filled with solder.

The optoelectronic element may include a photoelement adapted to convert light into electrical signals.

An interstice at an edge of a surface of the optoelectronic element that faces the printed circuit board may be substantially filled with solder.

The ground pad may be symmetrical, e.g., the ground pad may be H-shaped.

The optoelectronic element may have a rectangular base area, and longer sides of the rectangular base area may be parallel with respect to shanks of the H-shaped ground pad.

The photoelement may be electrically conductively attached to the ground pad by a solder connection, and a circuit track ending on the ground pad may be provided to conduct the electrical signals.

The photoelement may be electrically conductively attached to the ground pad by a solder connection, and a through-contact ending on the ground pad may be provided to conduct the electrical signals.

According to an example embodiment of the present invention, a method for manufacturing an optoelectronic system includes: providing a printed circuit board including a ground pad and a bond pad; applying soldering paste onto the ground pad; placing an optoelectronic element on the ground pad; melting the soldering paste and subsequently cooling to fasten the optoelectronic element to the ground pad by a solder connection, the ground pad arranged so that a part of an interstice between the printed circuit board and the optoelectronic element is not filled with solder; and establishing a contact between the optoelectronic element and the bond pad by a bonding wire.

The method may include optically ascertaining a position of the optopelectronic element for exact positioning of the bonding wire prior to the establishing step.

The soldering paste may be applied in the applying step distributed into several deposits on a surface of the ground pad.

According to an example embodiment of the present invention, a method for manufacturing an optoelectronic system includes: applying soldering paste onto a ground pad of a printed circuit board; placing an optoelectronic element on the ground pad; melting the soldering paste and subsequently cooling to fasten the optoelectronic element to the ground pad by a solder connection, the ground pad arranged so that a part of an interstice between the printed circuit board and the optoelectronic element is not filled with solder; and establishing a contact between the optoelectronic element and a bond pad of the printed circuit board by a bonding wire.

Other features and aspects of example embodiments of the present invention are described in more detail below with reference to the appended Figures.

DETAILED DESCRIPTION

Figure 1:
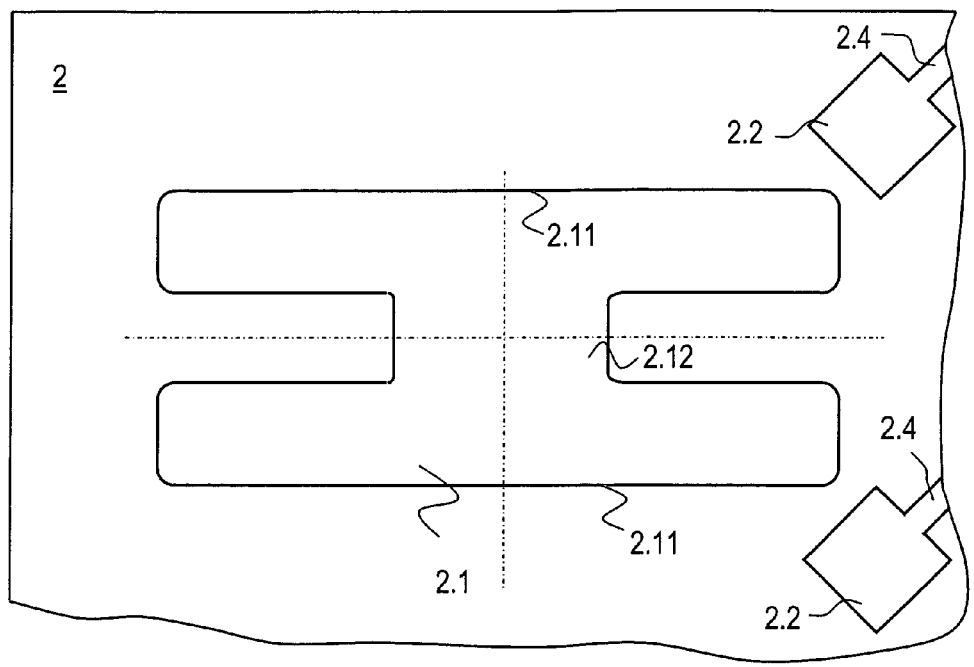
FIG. 1 is a top view of a section of a printed circuit board of an optoelectronic system without a photoelement.

FIG. 1 is a top view of a small section of a printed circuit board 2. Printed circuit board 2 has a multitude of soldering pads, only one ground pad 2.1 and two bond pads 2.2 being illustrated in the displayed section for clarity. Ground pad 2.1, which in the example illustrated is made of metal-coated copper, is arranged in an H-shape and is thus symmetric with respect to each of the two dashed axes in FIGS. 1 to 3 or centrosymmetric with respect to the intersection of the represented axes. Corresponding to the H-shaped arrangement, ground pad 2.1 has two parallel shanks 2.11. A crosspiece 2.12 connects the two shanks 2.11.

Printed circuit board 2 furthermore includes circuit tracks 2.4, which are in each case connected to bond pads 2.2. Normally, this kind of printed circuit board 2 carries a multitude of ground pads 2.1, bond pads 2.2 and the associated circuit tracks 2.4, which are arranged on printed circuit board 2 according to a predefined pattern.

Figure 2:
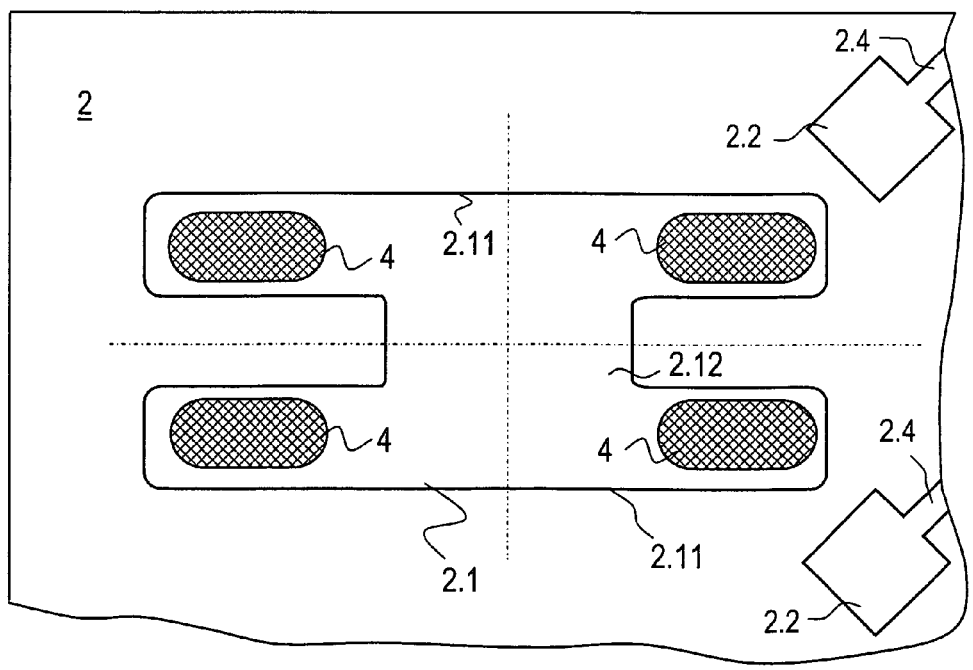
FIG. 2 is a top view of a section of a printed circuit board of an optoelectronic system without a photoelement, but including applied soldering paste.

On a printed circuit board configured in this manner, in a first manufacturing step as illustrated in FIG. 2, soldering paste 4 is applied, e.g., using a screen-printing technique onto ground pad 2.1, soldering paste 4 not being applied in the form of one large drop in the exemplary embodiment illustrated. Rather, soldering paste 4 is distributed in several drops or separate deposits (e.g., four deposits as illustrated) on the surface of ground pad 2.1.

Figure 3:
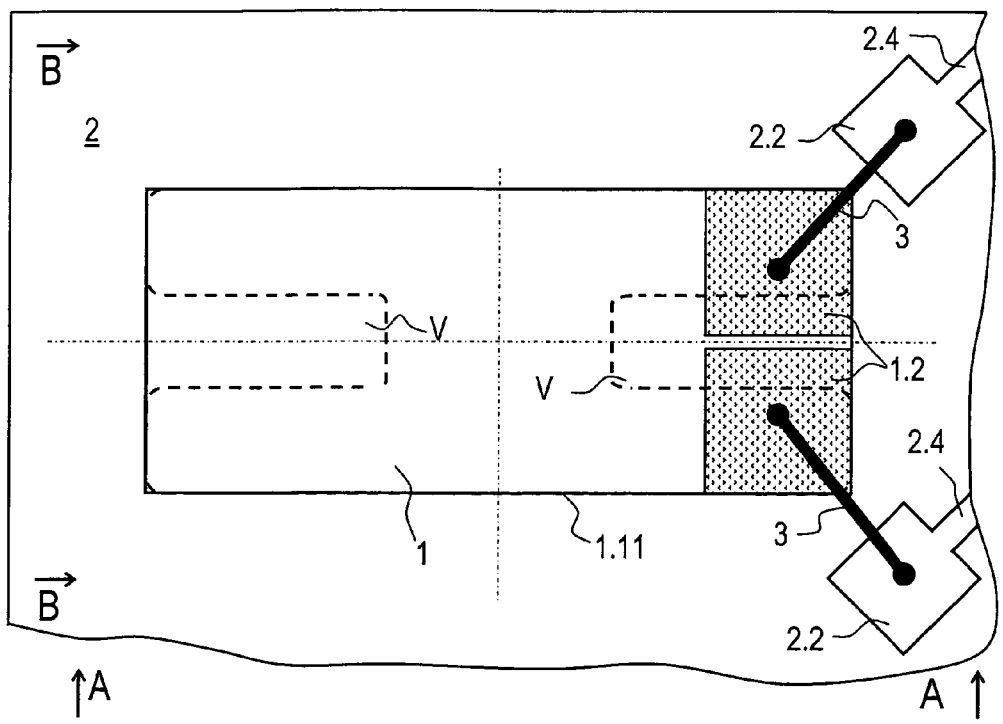
FIG. 3 is a top view of a section of a printed circuit board of an optoelectronic system including a photoelement.
Figure 4:
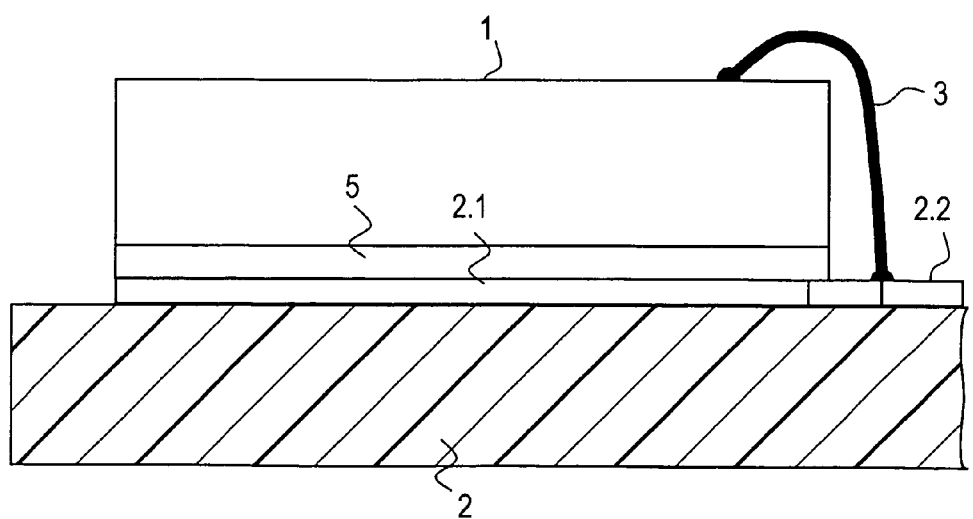
FIG. 4 is a cross-sectional view of the printed circuit board of the optoelectronic system taken along the line A-A illustrated in FIG. 3.
Figure 5:
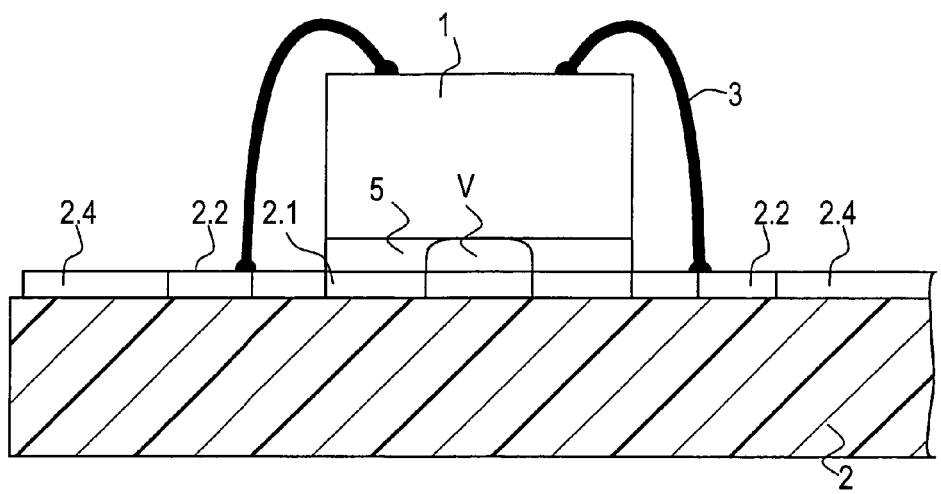
FIG. 5 is a cross-sectional view of the printed circuit board of the optoelectronic system taken along the line B-B illustrated in FIG. 3.

Thereafter, an optoelectronic element in the form of a rectangular photoelement 1 as illustrated in FIG. 3 is set onto the deposits of soldering paste 4 or placed on ground pad 2.1. It may be provided that photoelement 1 may rest on several comparatively small regions (deposits) on soldering paste 4 since in this case a plane-parallel alignment of photoelement 1 with respect to printed circuit board 2 is reproducibly achieved in this manufacturing phase. The placement is performed such that the longer sides 1.11 of photoelement 1 are parallel with respect to shanks 2.11 of H-shaped ground pads 2.1.

Photoelement 1 as illustrated is an unhoused component in the form of a semiconductor cuboid, e.g., made of silicon, e.g., a CMOS chip, having a rectangular base area (in this case 1 mm×2.6 mm). The surface that rests on soldering paste 4 is metal-plated in its entirety. The active surface, which is irradiated in later operation, is silvery-shiny and extremely smooth and hence reflects light to a large degree. Two regions of the surface of photoelement 1 are arranged as a bonding layer 1.2.

After photoelement 1 has been placed on ground pad 2.1, printed circuit board 2 together with photoelements 1 is heated in an oven until soldering paste 4 melts. Liquid soldering paste 4 in the process only wets the surface of ground pad 2.1, but not the remaining surface of printed circuit board 2. Additionally, the metal-plated surface of photoelement 1 is wetted by the liquid soldering paste 4. To what extent and at what thickness this surface is wetted depends on how much soldering paste 4 is applied. The quantity of the applied soldering paste 4 is subject to certain tolerances. The metal-plating of photoelement 1 over its entire surface may even out these tolerance because, depending on the quantity of soldering paste 4, the wetting of those surface portions that are not directly above ground pad 2.1 will vary in an equalizing manner. With more soldering paste 4, accordingly more of the surface of photoelement 1 (and possibly at a greater thickness) will be wetted, and namely in a region that is not above ground pad 2.1 such that the distance between printed circuit board 2 and photoelement 1 is largely independent of the actual quantity of soldering paste 4.

Since soldering paste 4 is distributed over several deposits that are spaced comparatively far apart from one another, the liquid soldering paste 4 of the individual deposits flows across large regions of the surface of ground pad 2.1 before uniting to form one liquid volume. This may provide that at each stage of the melting of soldering paste 4 there is an even thickness of liquid soldering paste 4 under photoelement 1, which may effectively prevent photoelement 1 from tilting in this phase as well (low meniscus). Photoelement 1 thus floats on top of soldering paste 4. Since ground pad 2.1 has an H-shaped design, a part V of the interstice between printed circuit board 2 and photoelement 1 is not filled with liquid soldering paste 4. The arrangement of ground pad 2.1 may ensure that photoelement 1 remains aligned plane-parallel with respect to printed circuit board 2.

In addition, the geometry of ground pad 2.1 also achieves a centering and a correct rotational angle orientation (pull-straight effect) of photoelement 1 relative to ground pad 2.1. For photoelement 1 floating on top of liquid soldering paste 4 should always strive for a position in which the long edges of photoelement 1 are aligned precisely parallel with respect to shanks 2.11 of ground pad 2.1 due to surface tension effects. In addition, photoelement 1 should assume a position in which its edges are exactly above the outer edges of ground pad 2.1 in order to minimize the surface energy. The edge regions of hollow part V of the interstice are arranged symmetrically such that the surface forces in this part V compensate each other and do not disturb the automatic alignment and orientation of photoelement 1 with respect to ground pad 2.1 on liquid soldering paste 4.

Conventional systems are provided with ground pads that are as large as possible because it is assumed that this would maximize the fastening and contacting quality. When using conventional large-surface ground pads, however, it happens not infrequently that the respective photoelement is tilted because the liquid soldering paste 4 forms an extremely high approximately hemispherically shaped meniscus.

Following the melting of soldering paste 4, the entire system is cooled down again such that liquefied soldering paste 4 converts into solid solder 5. In the process, photoelement 1 is mechanically fastened to ground pad 2.1 and to printed circuit board 2. Following the cooling down process, photoelement 1 is still plane-parallel with respect to printed circuit board 2. This is achieved in that ground pad 2.1 is arranged such that part V of the interstice between printed circuit board 2 and photoelement 1 is not filled by the now solid solder 5. Particularly significant in this connection is the H-shaped arrangement of ground pad 2.1. For photoelement 1 rests in its edge region essentially along the longer sides on solder 5 such that tilting may be minimized. Thus the interstice at the edge of the surface of photoelement 1, which faces printed circuit board 2, is for the most part filled with solder 5. Only at its short sides is photoelement 1 not soldered in the midsections of the edge regions. The part V of the interstice that is not filled with solid solder 5 is essentially not located at the edges of photoelement 1. In the exemplary embodiment illustrated, only approximately 10% of the circumferential line or the edge is not wetted by solder 5.

In the next step, the preparations are made for wire bonding. In this connection, printed circuit board 2 is first laid plane-parallel with respect to an optical inspection camera into a manufacturing device in order to ascertain the precise position of photoelements 1. The plane-parallelism of each photoelement 1 with respect to printed circuit board 2 thus may ensure a correct and uniform orientation of the surfaces of all photoelements 1 with respect to the inspection camera. For determining the position, the measurement should not be distorted by reflection rays of photoelements 1 that are reflected at an angle. The plane-parallelism of photoelements 1 with respect to printed circuit board 2 may prevent the distortions in measurement and may allow for the position of the respective photoelement 1 to be ascertained quickly and precisely.

If the precise position of photoelement 1 is known, then in the course of wire bonding bonding wires 3 may be contacted precisely at the designated location on photoelement 1, e.g., on bonding layer 1.2. Likewise, a spot-on accuracy is also possible when bonding wires 3 contact bond pads 2.2.

That is, prior to establishing contact between photoelement 1 and bond pad 2.2 via a bonding wire 3, the position of photoelement 1 is optically ascertained, among other things, so as to position bonding wire 3 precisely on photoelement 1 or on its bonding layer 1.2.

After photoelement 1 has made contact with bond pads 2.2 via bonding wires 3 and has been fastened to ground pad 2.1 by the solder connection, it is encapsulated with a transparent encapsulating material. In the process, bonding wires 3 are also encapsulated by the encapsulating material for protection against external influences.

As soon as light strikes the surface of photoelement 1 in the optoelectronic system thus produced, the illustrated exemplary embodiment being, e.g., a photodetector system, this light is converted into electrical signals which may be measured at both bond pads 2.2.

Figure 6:
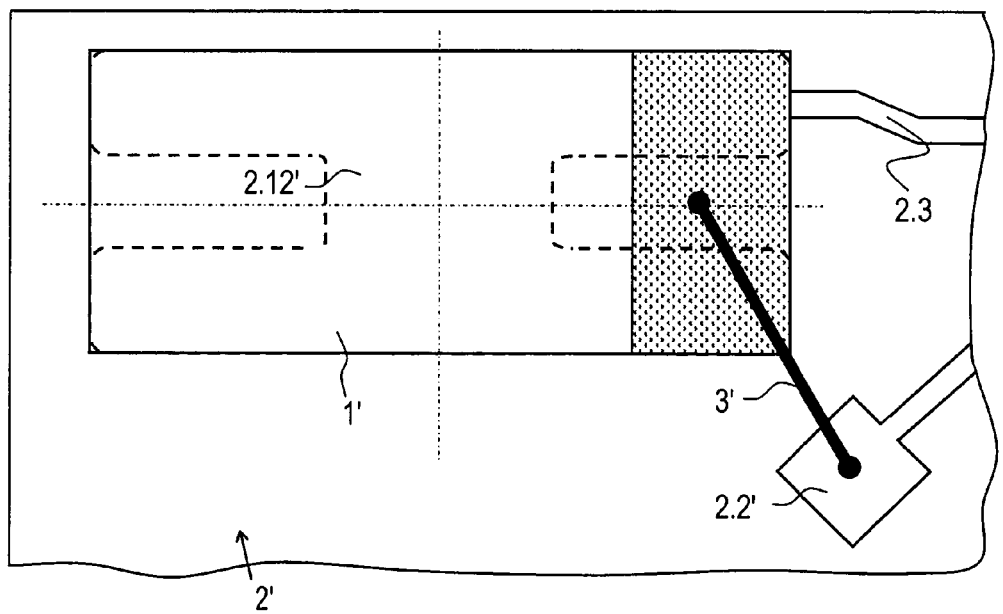
FIG. 6 is a cross-sectional view of a printed circuit board of an optoelectronic system.

In a modification hereof, a photoelement 1' may be provided as illustrated in FIG. 6, in which the electrical signals are transmitted via only one bonding wire 3' and via ground pad 2.1' to printed circuit board 2'. Ground pad 2.1' is the terminal point of a circuit track 2.3, which is made of metal-plated copper, and via which the electrical signals are conducted. Thus, ground pad 2.1' is not only used for the plane-parallel mechanical fastening of photoelement 1', but additionally also for establishing electrical contact with it. The electrical signals may then be measured on ground pad 2.1' or on printed circuit board 2.3, and on bond pad 2.2'.

Ground pad 2.1' may be provided with a through-contact through printed circuit board 2' so that circuit track 2.3 may be eliminated. This through-contact meets ground pad 2.1' in the region of crosspiece 2.12' whose surface is dimensioned accordingly. Thus, the electrical signals may be measured on ground pad 2.1' or on the through-contact, and on bond pad 2.2'.

The photodetector system may be built into an optical position measuring device. For this purpose, printed circuit board 2, 2' is mounted with positional accuracy on a surface of the relevant position measuring device. The achieved plane-parallel alignment of the photoelements 1, 1' with respect to printed circuit board 2, 2' then also may automatically ensure that the light to be detected strikes each individual photoelement 1, 1' at the intended angle of incidence, which ultimately may improve the functioning of the position measuring device.

What is claimed is:

1. An optoelectronic system, comprising:
    a printed circuit board including a ground pad and a bond pad;
    an optoelectronic element electrically connected to the bond pad by a bonding wire and fastened to the ground pad by a soldered connection, the ground pad arranged so that a part of an interstice between the printed circuit board and the optoelectronic element is not filled with solder;
    wherein the ground pad is symmetrical and H-shaped; and
    wherein the optoelectronic element has a rectangular base area and longer sides of the rectangular base area are parallel with respect to shanks of the H-shaped ground pad.

2. The optoelectronic system according to claim 1, wherein the optoelectronic element includes a photoelement adapted to convert light into electrical signals.

3. The optoelectronic system according to claim 2, wherein the photoelement is electrically conductively attached to the ground pad by a solder connection, a circuit track ending on the ground pad to conduct the electrical signals.

4. The optoelectronic system according to claim 2, wherein the photoelement is electrically conductively attached to the ground pad by a solder connection, a through-contact ending on the ground pad to conduct the electrical signals.

5. The optoelectronic system according to claim 1, wherein an interstice at an edge of a surface of the optoelectronic element that faces the printed circuit board is substantially filled with solder.

* * * * *